United States Patent [19]

Kalubowila et al.

[11] Patent Number: 4,549,043
[45] Date of Patent: Oct. 22, 1985

[54] ELECTRONIC CONDUCTOR AND A METHOD OF MANUFACTURING IT

[75] Inventors: Prematilaka W. Kalubowila, London; Stanislaw P. Wach, Kent; Michael B. Levens, Chester, all of United Kingdom

[73] Assignee: Shell Oil Company, Houston, Tex.

[21] Appl. No.: 568,020

[22] Filed: Jan. 4, 1984

[30] Foreign Application Priority Data

Jan. 19, 1983 [GB] United Kingdom ............... 8301385

[51] Int. Cl.$^4$ .................... H01B 1/02; H01B 5/02; H01B 5/14
[52] U.S. Cl. ............................. 174/133 R; 29/846; 156/151; 174/68.5; 174/126 CP; 204/15; 204/38.5; 204/40; 427/123; 427/405; 428/644
[58] Field of Search ............ 174/68.5, 68 A, 126 CP, 174/133 R; 156/150, 151, 901; 29/825, 829, 842, 846, 847; 428/615, 643, 644, 674, 901; 420/469; 361/402; 427/123, 405; 204/15, 38.5, 40

[56] References Cited

U.S. PATENT DOCUMENTS

| 2,183,592 | 12/1939 | Silliman | 420/469 X |
| 3,144,327 | 8/1964 | Schmidt et al. | 420/469 X |
| 3,872,356 | 3/1975 | Kruger et al. | 361/402 |

OTHER PUBLICATIONS

"IBM Technical Disclosure Bulletin" by Cheliniak et al., vol. 10, No. 1, Jun. 1967, p. 11.

Primary Examiner—Laramie E. Askin
Assistant Examiner—Morris H. Nimmo

[57] ABSTRACT

An electronic conductor and a method for manufacturing it are provided. The conductor is made of a base of substantially copper having a diffusion barrier on the base and a coating of tin-lead, or of tin, on the diffusion barrier. The diffusion barrier is either copper in combination with phosphorus, or copper in combination with boron. The method of manufacturing an electronic conductor applies the diffusion barrier to the base by means of an electro-deposition process and then applies the coating on the diffusion barrier.

9 Claims, 1 Drawing Figure

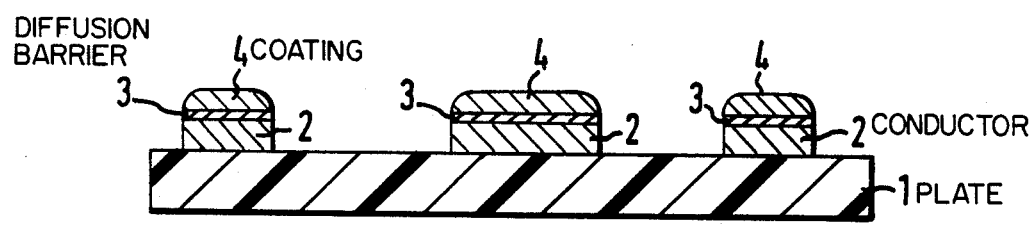

ELECTRONIC CONDUCTOR AND A METHOD OF MANUFACTURING IT

BACKGROUND OF THE INVENTION

The invention relates to an electronic conductor comprising a base conductor made of copper or containing mainly copper and provided with a coating of tin-lead or of tin.

Such electronic conductors are known and are used on a large scale in electronic equipment, for example on printed circuit boards, or as terminals of electronic components.

The coating of tin-lead or of tin protects the base conductor, so that corrosion of the base conductor is prevented and furthermore the coating facilitates the making of connections between various electronic components by soldering.

A problem with such electronic conductors is that material from the coating, in particular tin and copper of the base conduit tend to interdiffuse and react with each other, so that the intermetallic compounds $Cu_3Sn$ and $Cu_6Sn_5$ are formed which are more difficult to solder. Said intermetallic compounds can be soldered only by the process of wetting which has the disadvantage that in soldering by modern automatised techniques the time may not be sufficiently long to promote wetting and hence good electrical contact.

In particular if the coating is very thin, for example about 5 $\mu$m, it is possible that the tin of the coating will react completely with the copper of the main conductor, so that only $Cu_3Sn$ is formed and soldering is hardly possible. This will occur, for example, as a result of storage of the electronic conductor during a relatively short period of time, for example about six weeks.

In order to deal with this problem, it has been proposed to arrange a diffusion barrier, comprising for example iron, or nickel or cobalt, between the coating and the base conductor, said diffusion barrier reducing the diffusion of tin from the coating into the base conductor and consequently the formation of intermetallic compounds. Such a diffusion barrier is described in U.S. Pat. No. 3,872,356 which was published on Mar. 18, 1975.

It is an object of the invention to provide an electronic conductor of the above kind having an improved diffusion barrier reducing the transfer of tin from the coating into the base conduit to a greater extent than the known diffusion barriers.

It is a further object of the invention to allow the application of a thinner coating of tin-lead or of tin, in the presence of the diffusion barrier, and thereby to effect a more economic use of the coating metal.

SUMMARY OF THE INVENTION

The electronic conductor according to the invention comprises a base conductor containing mainly copper and provided with a coating of tin-lead or of tin, wherein a diffusion barrier is arranged between the coating and the base conductor and wherein the diffusion barrier comprises either copper in combination with phosphorus or copper in combination with boron.

A method of manufacturing such an electronic conductor comprises applying copper in combination with phosphorous or copper in combination with boron to the base conductor by an electro-deposition process, in order to form the diffusion barrier, and then applying the coating on the diffusion barrier.

After the application of the diffusion barrier on the base conductor, the coating may be applied by an electro-deposition process or by dipping the base conductor into molten tin or into molten tin-lead.

BRIEF DESCRIPTION OF THE DRAWING

The drawing shows a cross-section of a printed circuit board constructed in accordance with the present invention.

DESCRIPTION OF THE INVENTION

As shown in the drawing a circuit board comprises a plate 1 made of suitable synthetic resin or glass. The plate carries a number of base conductors 2 made of copper or containing mainly copper. The base conduits 2 are applied on the plate 1 by an electro-deposition process or by any other suitable method known in the art.

Each of the base conductors 2 is provided with a diffusion barrier 3, which comprises either copper in combination with phosphorus or copper in combination with boron. The diffusion barrier 3 is applied on the base conductor 2 by means of suitable electro-deposition processes which will be described below.

On each diffusion barrier 3, a coating 4 of tin or of tin-lead is present. After the application of the diffusion barrier 3, the coating 4 may be applied by a suitable electro-deposition process or by dipping the base conductor 2 into molten tin or into molten tin-lead.

The diffusion barrier 3, comprising copper in combination with phosphorus, is applied by means of a copper-phosphorus electro-deposition process, wherein an electro-plating bath is used having the following composition:

| Substance | Concentration in g/dm$^3$ of aqueous solution |
|---|---|
| Cupric chloride, $CuCl_2.2H_2O$ (s) | 60–70 |
| Phosphorous acid, $H_3PO_3$ (s) | 10–15 |
| Orthophosphoric acid, $H_3PO_4$ (l) (density 1.75 g/cm$^3$) | 40–50 |

The operating conditions are as follows:

| Temperature | 40–45° C. |
|---|---|
| Current density | 0.3–1.5 A/dm$^2$ |
| pH at 22° C. | 1–0.5 |

The resulting product is Cu-P with a phosphorus content of 0.05–0.15% weight.

The diffusion barrier 3, comprising copper in combination with phosphorus is also applied by means of a copper-phosphorus electro-deposition process, wherein an electroplating bath is used having the following composition:

| Substance | Concentration in g/dm$^3$ of aqueous solution |
|---|---|
| Cupric sulphate, $CuSO_4.5H_2O$ (s) | 25–35 |
| Phosphoric acid, $H_3PO_4$ (l) (density 1.75 g/cm$^3$) | 20–30 |
| Phosphorous acid, $H_3PO_3$ (s) | 10–15 |

The operating conditions are as follows:

| | |
|---|---|
| Temperature | 40-45° C. |
| Current density | 0.3-1.5 A/dm$^2$ |

The resulting product is Cu-P with a phosphorus content of 0.03-0.15% weight.

The diffusion barrier 3, comprising copper in combination with boron, is applied by means of a copper-boron electro-deposition process, wherein an electroplating bath is used having the following composition:

| Substance | Concentration in g/dm$^3$ of aqueous solution |
|---|---|
| Cupric sulphate, CuSO$_4$.5H$_2$O (s) | 25-35 |
| Boric acid, H$_3$BO$_3$ (s) | 35-45 |

The operating conditions are as follows:

| | |
|---|---|
| Temperature | 20-25° C. |
| Cathode current density | 0.5-1.0 A/dm$^2$ |

The anode/cathode area ratio is for example 1:1 and the anodes are of copper.

The resulting product is Cu-B with a boron content of up to 0.02% weight.

Finally, the coating 4 is applied on the diffusion barrier 3. The thickness of the coating 4 is for example in the range of from about 0.25 μm to about 25 μm.

What is claimed is:

1. An electronic circuit board conductor comprising: a base made substantially of copper; a diffusion barrier comprising copper in combination with phosphorus or with boron disposed on said base; and a coating of substantially tin disposed on said diffusion barrier.

2. An electronic conductor as claimed in claim 1, wherein said base is a strip.

3. An electronic conductor as claimed in claim 1, wherein the thickness of the coating of substantially tin is in the range of from about 0.25 μm to about 25 μm.

4. A method of manufacturing an electronic conductor, comprising: applying copper in combination with phosphorus to a base made substantially of copper by an electro-deposition process to form a diffusion barrier thereon, and then applying a coating of substantially tin on said diffusion barrier.

5. The method as claimed in claim 4, wherein the coating is applied by an electro-deposition process.

6. The method as claimed in claim 4, wherein the coating is applied by dipping the base into a molten material comprising substantially tin.

7. A method of manufacturing an electronic conductor comprising: applying copper in combination with boron to a base made substantially of copper by an electro-deposition process to form a diffusion barrier thereon, and then applying a coating of substantially tin on said diffusion barrier.

8. The method as claimed in claim 7, wherein the coating is applied by an electro-deposition process.

9. The method as claimed in claim 7, wherein the coating is applied by dipping the base into a molten material comprising substantially tin.

* * * * *